United States Patent
Arndt et al.

(10) Patent No.: US 10,704,910 B2
(45) Date of Patent: Jul. 7, 2020

(54) DUTY-CYCLED PHASE SHIFTER FOR ANGULAR RATE SENSOR

(71) Applicant: Apple Inc., Cupertino, CA (US)

(72) Inventors: Gregory B. Arndt, Campbell, CA (US); Christopher C. Painter, Dublin, CA (US)

(73) Assignee: Apple Inc., Cupertino, CA (US)

( * ) Notice: Subject to any disclaimer, the term of this patent is extended or adjusted under 35 U.S.C. 154(b) by 261 days.

(21) Appl. No.: 15/692,164

(22) Filed: Aug. 31, 2017

(65) Prior Publication Data

US 2018/0080769 A1    Mar. 22, 2018

Related U.S. Application Data

(60) Provisional application No. 62/398,393, filed on Sep. 22, 2016.

(51) Int. Cl.

| | |
|---|---|
| *G01C 19/5776* | (2012.01) |
| *H03L 7/081* | (2006.01) |
| *H03K 5/131* | (2014.01) |
| *H03K 5/156* | (2006.01) |
| *H03G 3/20* | (2006.01) |

(52) U.S. Cl.
CPC ......... *G01C 19/5776* (2013.01); *H03K 5/131* (2013.01); *H03K 5/1565* (2013.01); *H03L 7/081* (2013.01); *H03G 3/20* (2013.01)

(58) Field of Classification Search
CPC .................................................. G01C 19/5776
USPC ....................................................... 375/327
See application file for complete search history.

(56) References Cited

U.S. PATENT DOCUMENTS

| | | | | |
|---|---|---|---|---|
| 5,179,438 | A * | 1/1993 | Morimoto | .............. H03K 5/131 327/263 |
| 6,020,872 | A * | 2/2000 | Mizukata | ............... G09G 5/008 345/213 |
| 2006/0181393 | A1* | 8/2006 | Raphaeli | ................. G01S 13/44 340/10.1 |
| 2011/0102036 | A1* | 5/2011 | Lin | ..................... H03K 5/15013 327/158 |
| 2012/0112811 | A1* | 5/2012 | Cook | ....................... H03K 7/08 327/175 |
| 2015/0355705 | A1* | 12/2015 | Weissmann | ........... G06F 1/3287 713/322 |

* cited by examiner

*Primary Examiner* — Lihong Yu
(74) *Attorney, Agent, or Firm* — Fish & Richardson P.C.

(57) ABSTRACT

An architecture is disclosed for an angular rate sensor that includes a duty-cycled phase shifter for generating a clock with high resolution delay for use in synchronized demodulation of a sensor output signal. In an embodiment, a sensor comprises: a mechanical resonator; a drive circuit coupled to the mechanical resonator and operable to actuate the mechanical resonator into resonant vibration; a sense circuit mechanically coupled to the mechanical resonator, the sense circuit operable to generate a sense signal having an in-phase signal component and a quadrature signal component; a demodulator circuit operable to receive the sense signal and a first clock for demodulating the sense signal to separate the in-phase signal component from the quadrature signal component; and a duty-cycled phase shifter coupled to the demodulator, the duty-cycled phase shifter operable to generate the first clock.

20 Claims, 6 Drawing Sheets

DUTY-CYCLED PHASE SHIFTER FOR ANGULAR RATE SENSOR

CROSS-REFERENCE TO RELATED APPLICATION

This application claims priority to U.S. Provisional Application No. 62/398,393, filed Sep. 22, 2016, the entire contents of which are incorporated herein by reference.

TECHNICAL FIELD

This disclosure relates generally to angular rate sensors.

BACKGROUND

Offset stability is a critical performance parameter in a number of applications that use angular rate sensors. For micro-electro-mechanical systems (MEMS) gyroscopes, spurious quadrature signals mechanically coupling into the sensing chain are a major source of offset stability. To achieve good offset stability versus time or temperature, it is important to control and adjust the phase shift used in the demodulation stage of the sensing chain of the angular rate sensor to reject the quadrature signals. In MEMS gyroscopes the quadrature signals can be substantial, requiring a high resolution delay to achieve the highest levels of offset performance. It can be difficult, however, to achieve a high resolution, low power phase shift. Existing solutions rely on either a very high frequency clock or a delay locked-loop, both of which consume more power than may be desired for some applications.

SUMMARY

An architecture is disclosed for an angular rate sensor that includes a duty-cycled phase shifter for generating a clock with high resolution delay for use in synchronized demodulation of an angular rate signal.

In an embodiment, a sensor comprises: a mechanical resonator; a drive circuit coupled to the mechanical resonator and operable to actuate the mechanical resonator into resonant vibration; a sense circuit mechanically coupled to the mechanical resonator, the sense circuit operable to generate a sense signal having an in-phase signal component and a quadrature signal component; a demodulator circuit operable to receive the sense signal and a first clock for demodulating the sense signal to separate the in-phase signal component from the quadrature signal component; and a duty-cycled phase shifter coupled to the demodulator, the duty-cycled phase shifter operable to generate the first clock.

In an embodiment, a method comprises: actuating, by a drive circuit of a sensor, a mechanical resonator into resonant vibration; generating, by a sense circuit of the sensor, a sense signal having an in-phase signal component and a quadrature signal component, the sense circuit mechanically coupled to the mechanical resonator; generating, by a duty-cycled phase shifter circuit of the sensor, a duty-cycled clock from a reference clock, the duty-cycled clock having a first delay resolution and the reference clock having a second delay resolution, where the first delay resolution is higher than the second delay resolution; and demodulating, by a demodulator circuit of the sensor, the sense signal using the duty-cycled clock to separate the in-phase signal component from the quadrature signal component.

In an embodiment, a demodulation circuit comprises: a demodulator circuit having a first input for receiving a modulated signal and a second input for receiving a first clock having a first delay resolution, the demodulator circuit operable to demodulate the modulated signal into in-phase and quadrature signal components using the first clock; and a duty-cycled phase-shifter circuit coupled to the demodulator circuit, the duty-cycled phase-shifter operable to generate the first clock from a second clock having a second delay resolution, where the first delay resolution is higher than the second delay resolution.

In an embodiment, a method comprises: demodulating, by a demodulator circuit, a modulated signal into in-phase and quadrature signal components using a duty-cycled clock; and generating, by a duty-cycled phase-shifter circuit, the duty-cycled clock from a reference clock, where the duty-cycled clock has a first delay resolution and the reference clock has a second delay resolution, and the first delay resolution is higher than the second delay resolution.

Particular embodiments disclosed herein provide one or more of the following advantages. The disclosed embodiments include a duty-cycled phase shifter for generating high resolution, low power delays to demodulate a sensed angular rate signal generated by, for example a MEMS gyroscope. The duty-cycled phase shifter allows for the realization of delay values that would otherwise be limited by the clock frequency. More particularly, the delay generated by a phase shifter is duty-cycled so that the resulting average delay can have values in-between the clock periods allowing for finer separation between in-phase signal components carrying angular rate information and spurious quadrature signal components carrying errors due to non-ideal factors. The duty-cycled delay uses less power for synchronized demodulation than conventional methods that may use a very high frequency clock or delay locked-loop.

The details of the disclosed embodiments are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

Example System

Figure 1:
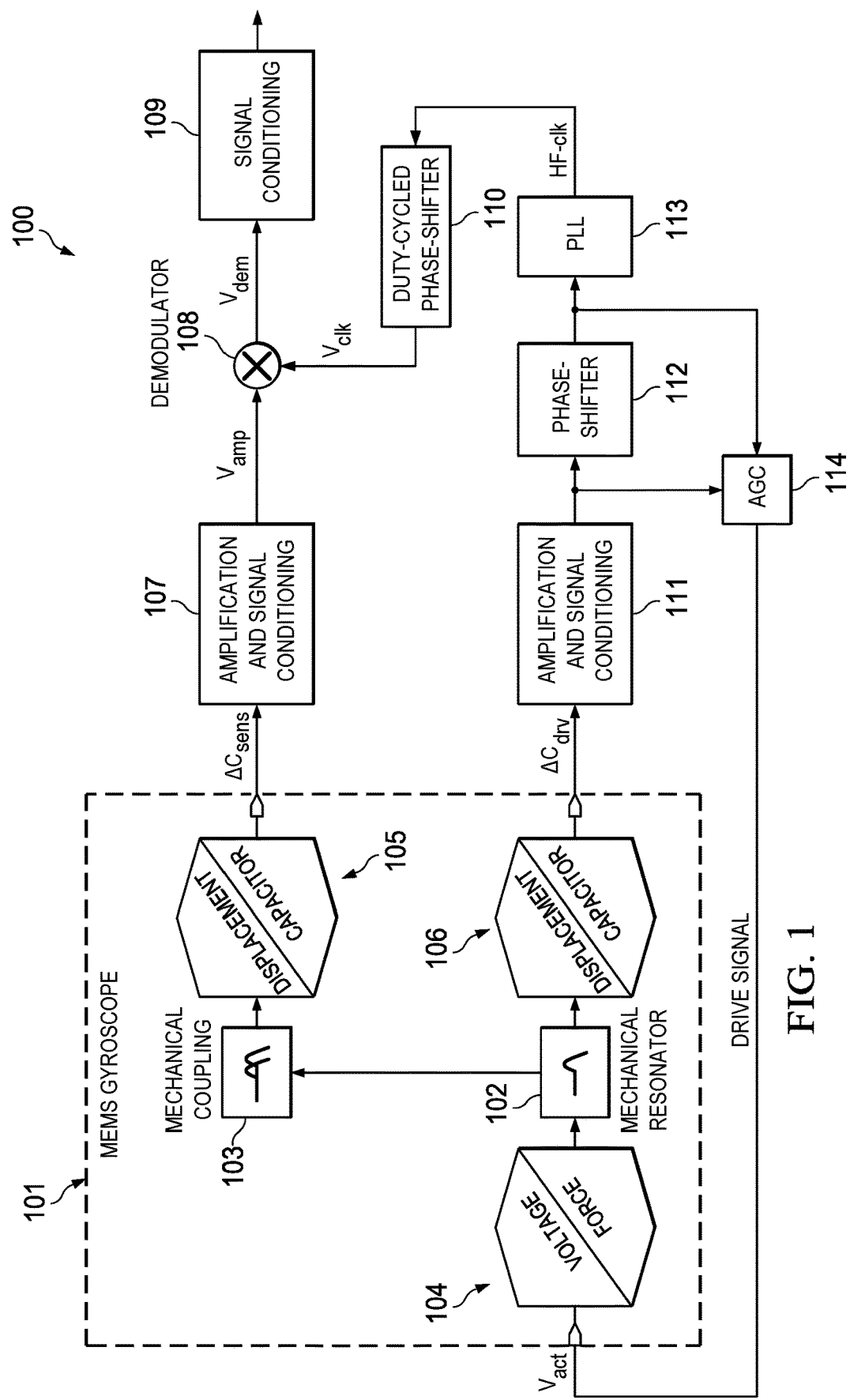
FIG. 1 is a conceptual block diagram of an example angular rate sensor with a duty-cycled phase shifter, according to an embodiment.

FIG. 1 is a conceptual block diagram of an example angular rate sensor 100 with a duty-cycled phase shifter, according to an embodiment. Angular rate sensor 100 includes MEMS gyroscope 101, amplification and signal conditioning circuit 107, demodulator circuit 108 and signal conditioning circuit 109. The circuits 107, 108 and 109 are collectively referred to as the "sensing chain." MEMS gyroscope 101 includes mechanical resonator 102, mechanical coupling 103 and transducers 104, 105, 106. Mechanical resonator 102 is actuated into resonant vibration with constant amplitude and direction by a drive control loop described below. When angular rate is applied to MEMS gyroscope 101, a Coriolis-effect-induced motion will be sensed that is proportional to the drive velocity and the input angular rate.

In this example embodiment, MEMS gyroscope 101 is a capacitive MEMS structure that uses differential capacitive sensing and transducer 105 is a displacement-to-capacitance transducer (X/C) that converts the displacement of mechanical resonator 102 into a sensed capacitance variation signal $\Delta C_{sens}$. Circuit 107 takes $\Delta C_{sens}$ as input and outputs a sense signal $V_{amp}$ (e.g., a voltage signal). In an embodiment, circuit 107 can include a bandpass filter that is applied to $\Delta C_{sens}$ to reduce out-of-band noise. Circuit 107 includes a capacitance-to-voltage converter that converts $\Delta C_{sens}$ to $V_{amp}$. The filtered sense signal $V_{amp}$ is then input into demodulator circuit 108 which uses clock $V_{clk}$ to generate in-phase and quadrature signal components by synchronized demodulation, where the in-phase signal component $V_{dem}$ includes the Coriolis signal (which carries the angular rate information), and the quadrature component (not shown) carries the error component due to non-ideal factors. The demodulated signal $V_{dem}$ can be further processed by signal conditioning circuit 109. For example, signal conditioning circuit 109 can be a low pass filter.

Angular rate sensor 100 further includes a "drive loop" comprising amplification and signal conditioning circuit 111, phase shifter 112, phase-locked loop (PLL) 113 and automatic gain control (AGC) 114. X/C transducer 106 converts the displacement of mechanical resonator 102 to provide capacitance variation signal $\Delta C_{drv}$-$\Delta C_{drv}$ is input into amplification and signal conditioning circuit 111 which converts, amplifies and filters $\Delta C_{drv}$ to provide a drive signal. In an embodiment, circuit 111 can include a bandpass filter that is applied to $\Delta C_{drv}$ to reduce out-of-band noise. The filtered drive signal is then input to AGC 114 and phase shifter 112. AGC 114 adjusts the gain of the drive signal according to the output of the amplification and signal conditioning circuit 111. Phase shifter 112 outputs a phase shifted differential signal which is feed back into MEMS gyroscope 101 through voltage-to-force (V/F) transducer 104. The feedback signal controls the resonant vibration of mechanical resonator 102. PLL 113 generates a high frequency reference clock (HF-clk) whose phase is related to the phase of the differential output signals of the phase shifter 112. HF-clk is input into demodulator 108 to demodulate $V_{amp}$ into $V_{dem}$.

Figure 2:
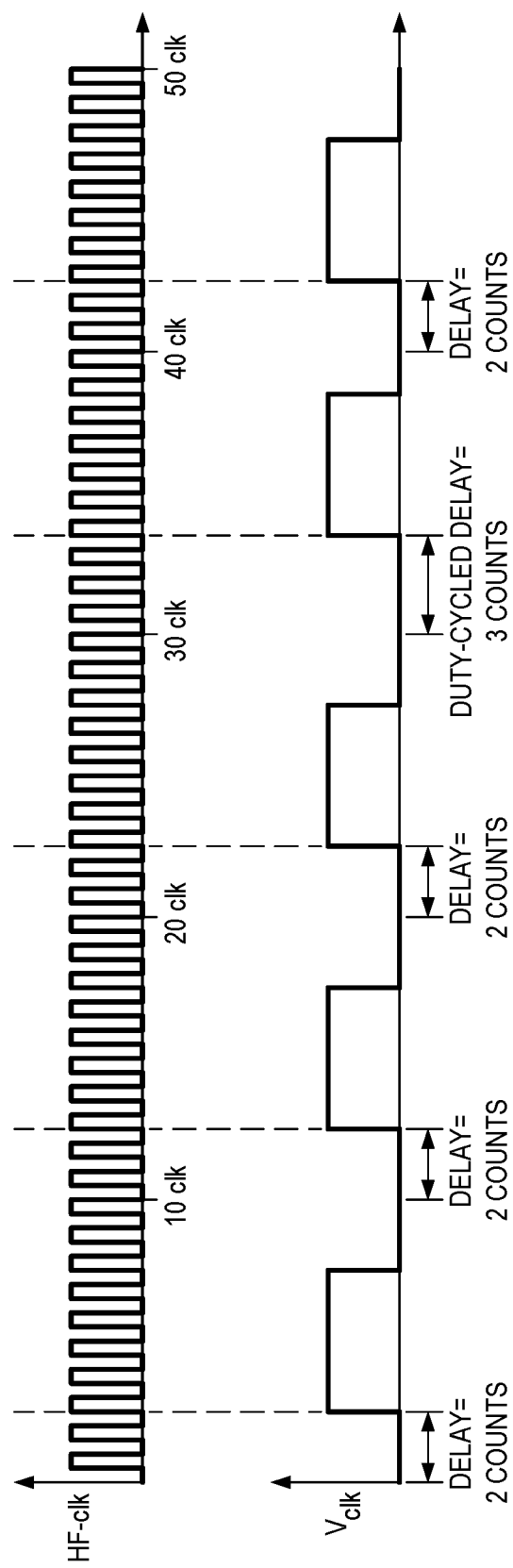
FIG. 2 illustrates the operation of the example duty-cycled phase shifter of FIG. 1, according to an embodiment.

FIG. 2 illustrates the operation of the example duty-cycled phase shifter of FIG. 1, according to an embodiment. For some applications, a typical quadrature error is about 10,000 degrees per second (dps). To achieve offset stability of 0.15 dps, the delay should be controlled with 0.5 mdeg accuracy. For a 20 kHz MEMS gyroscope driving frequency, the delay should be controlled with 0.75 ns resolution. Assuming that the high frequency clock HF-clk output by PLL 113 is 1000*20 kHz or 20 MHz, the delay resolution would be 50 ns, which is greater than the desired 0.75 ns resolution. The delay resolution can be improved by increasing the HF-clk or adding a delay locked-loop. These solutions, however, would result in more power consumption, which is not desirable for use in some applications that have limited power sources, such as battery-powered mobile devices. An alternative solution is to use a duty-cycled phase shifter as described in reference to FIGS. 3 and 4.

Referring now to FIG. 2, the advantages of using a duty-cycled phase shifter are illustrated. The minimum duty-cycled phase shifter frequency ($f_{duty\text{-}cycle\ PS}$) is set by the gyroscope bandwidth and is given by Equation [1]:

$$\Delta t_{avg} = \frac{1}{f_{HF-clk}} * \frac{f_{duty-cycle\ PS}}{f_{gyro}}. \qquad [1]$$

Assuming, $f_{HF\text{-}clk}$=20 MHz, $f_{duty\text{-}cycle\ PS}$=200 Hz, and $f_{gyro}$=20 kHz, we get an average delay of $\Delta t_{avg}$=0.5 ns, which meets the requirements for a high resolution, low power phase shift. FIG. 2 shows a high frequency clock (HP-clk) in relation to $V_{clk}$ with an average delay $\Delta t_{avg}$. Note that for example shown in FIG. 2 the high frequency clock (HF-clk) is 200 kHz and the minimum duty-cycled phase shifter frequency ($f_{duty\text{-}cycle\ PS}$) is 5 kHz and the average delay of $V_{clk}$ is 2.2 clocks over 50 HF-clk pulses.

Figure 3:
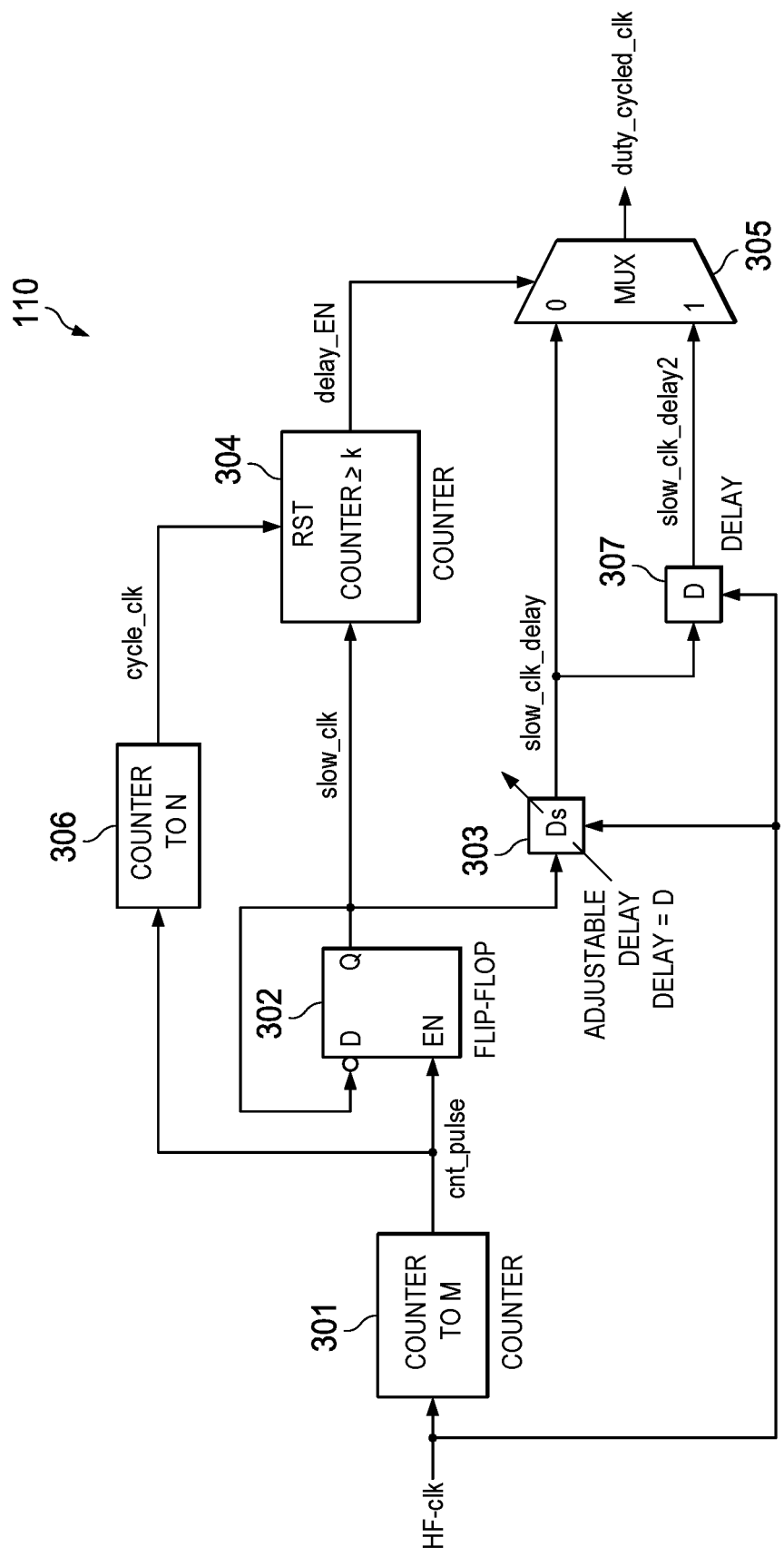
FIG. 3 is block diagram of the example duty-cycled phase shifter of FIG. 1, according to an embodiment.

FIG. 3 is block diagram of the example duty-cycled phase shifter 110 of FIG. 1, according to an embodiment. Duty-cycled phase shifter 110 converts a high frequency clock (HF-clk) into a duty-cycled clock (duty_cycled_clk). In an embodiment, duty-cycled phase shifter 110 includes count-to-M counter 301, latch circuit 302, adjustable delay block 303, count-to-≥k counter 304, multiplexer 305, count-to-N counter 306 and delay block 307. Circuit 110 is an example circuit topology and other circuit topologies are also possible that provide a duty-cycled clock from a high frequency clock.

Figure 4:
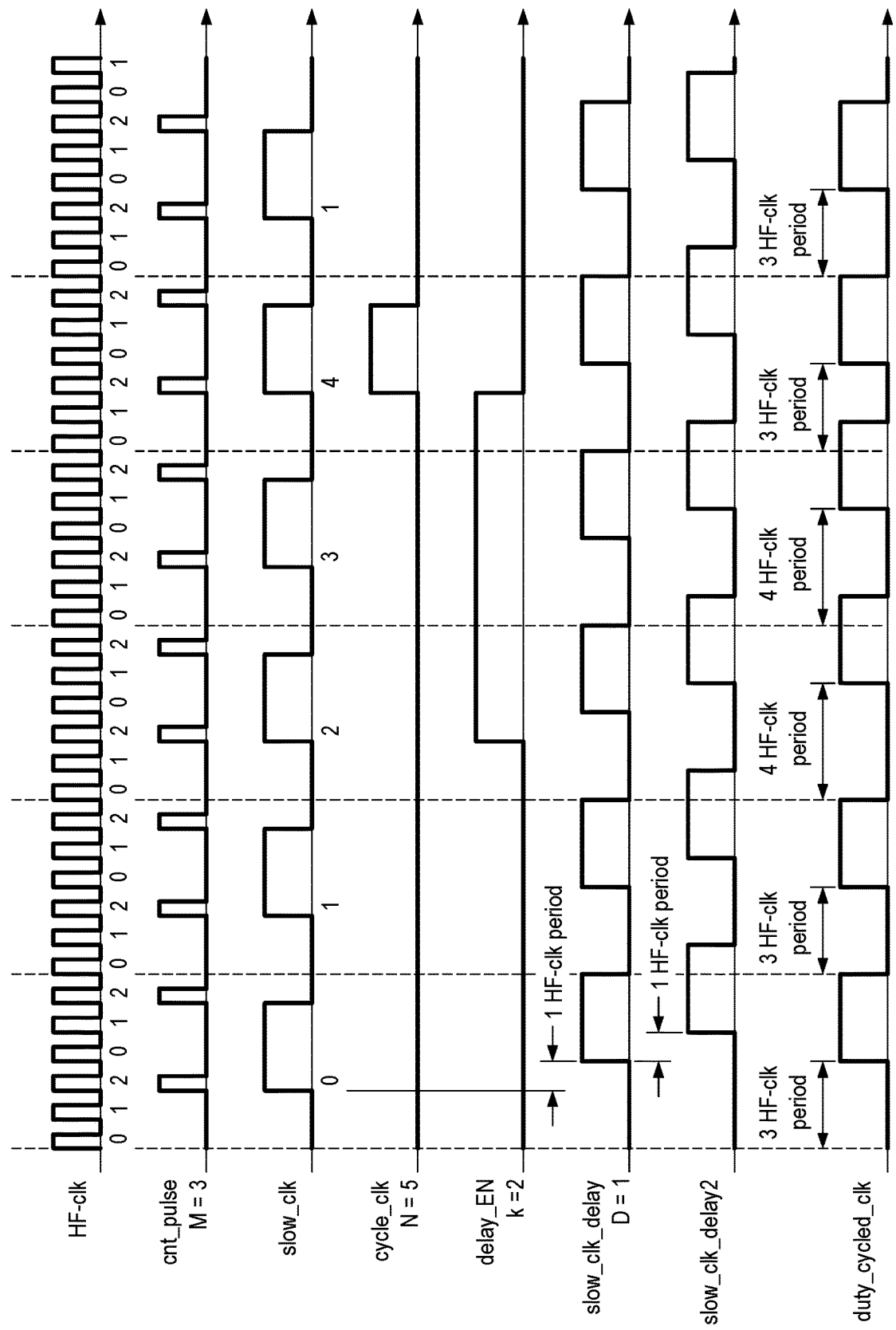
FIG. 4 illustrates waveforms associated with the duty-cycled phase shifter of FIG. 3, according to an embodiment.

FIG. 4 illustrates waveforms associated with the duty-cycled phase shifter of FIG. 1. The waveforms from top to bottom include high frequency clock (HF-clk), cnt_pulse (M=3), slow_clk, cycle_clk (N=5), delay_EN (K=2), slow_clk_delay (D=1), slow_clk_delay2 and duty_cycled_clk. The operation of duty-cycled phase shifter 110 will now be described with reference to FIGS. 3 and 4.

In an embodiment, counter 301 is a count-to-M counter, which generates an output pulse for every M counts. For example, if M=3 (as shown) counter 301 transitions its output to high every 3 counts, thereby generating a series of pulses (cnt_pulse). The output of counter 301 is input into an enable input (EN) of latch circuit 302 (e.g., a D flip-flop) and an input of count-to-N counter 306. Latch circuit 302 tracks the output of counter 301, with the output (Q) providing a clock (slow_clk) with transitions that match transitions of the output of counter 301 (cnt_pulse). Count-to-N counter 306 generates an output clock for every N counts. For example, if N=5 (as shown) counter 306 transitions its output to high every 5 counts, thereby generating a clock (cycle_clk).

The output of latch circuit 302 (slow_clk) is coupled to the input (D) of latch circuit 302. The output (Q) of latch circuit 302 is also coupled to an input of adjustable delay block 303 and an input of count-to-≥k counter 304. Counter 304 generates a delay enable signal (delay_EN) that is coupled to a selector input of multiplexer 305. The delay enable signal is reset to 0 every duty cycle period.

Adjustable delay block 303 is coupled to HF-clk and provides a delayed clock (slow_clk_delay) which is input into a first input (0) of multiplexer 305, which in this example is a 2:1 multiplexer. An output of adjustable delay block 303 (slow_clk_delay) is also input into delay block 307. An input of delay block 307 is coupled to HF-clk and provides a delayed clock signal (slow_clk_delay2) to a second input (1) of multiplexer 305. An output of multiplexer 305 is a duty-cycled clock (duty_cycled_clk). The duty-cycled clock can be used to provide the clock $V_{clk}$ for synchronized demodulation, as described in reference to FIG. 1.

Example Processes

Figure 5:
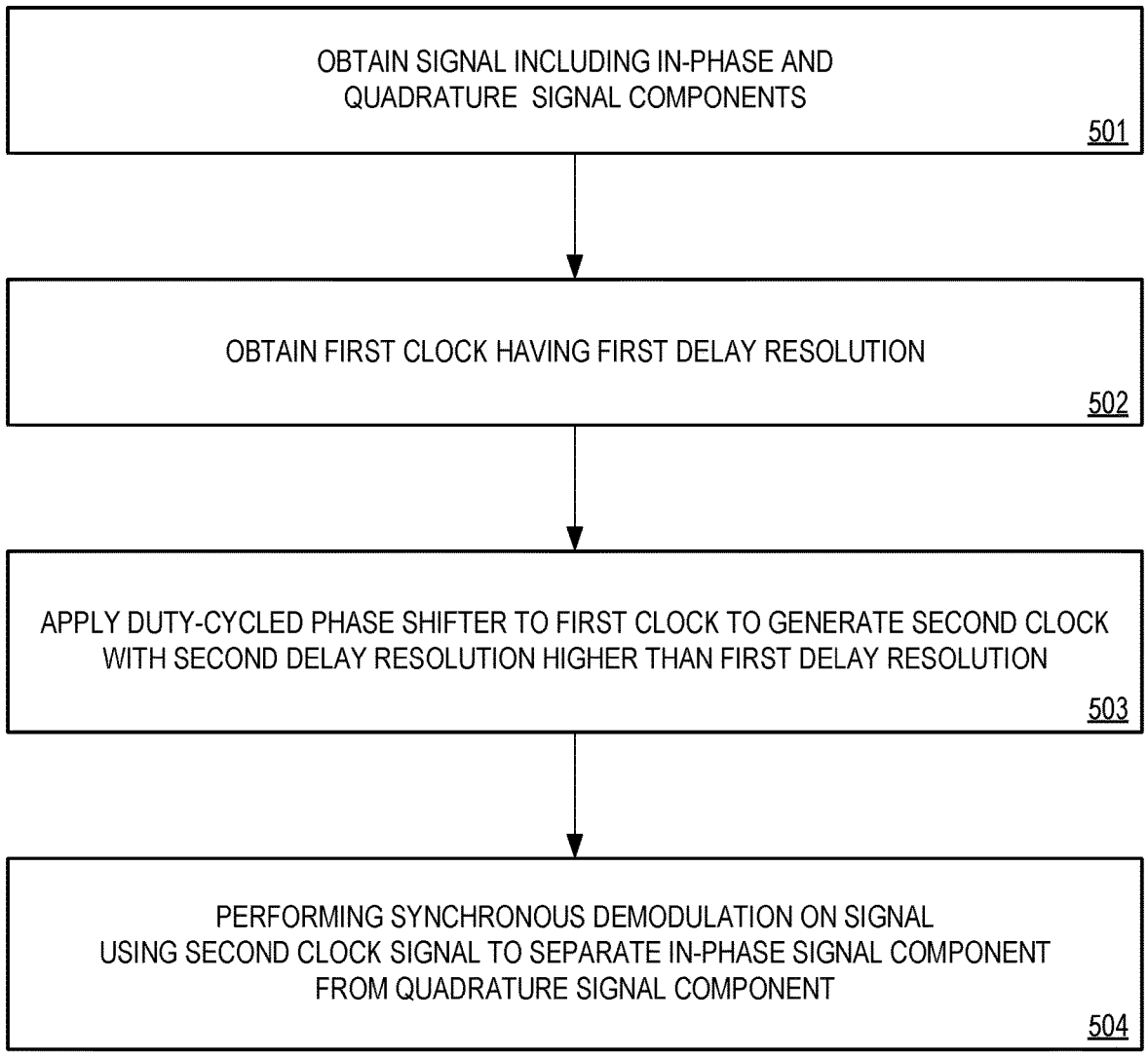
FIG. 5 is a flow diagram of an example process of demodulating a signal using a duty-cycled phase shifter, according to an embodiment.

FIG. 5 is a flow diagram of an example process 500 of demodulating a signal using a duty-cycled phase shifter, according to an embodiment. Process 500 can be implemented according to FIGS. 1-4 and the device architecture of FIG. 6.

In an embodiment, process 500 can begin by obtaining a signal (e.g., a modulated signal) including an angular rate information (a Coriolis signal) and a quadrature signal (501). Process 500 can continue by obtaining a first clock having a first delay resolution (502) and applying a duty-cycled phase shifter to the first clock to generate a second clock with a second delay resolution that is higher than the first delay resolution (503). Process 500 then performs synchronous demodulation on the signal using the second clock (504). For example, the first clock can be a high frequency clock generated by a PLL and the second clock can have a duty-cycled average time delay to provide sufficient delay resolution to separate an in-phase signal component (carrying the angular rate information) and a quadrature signal component (carrying error due to non-ideal factors) based on their 90° of phase separation.

Example Device Architecture

Figure 6:
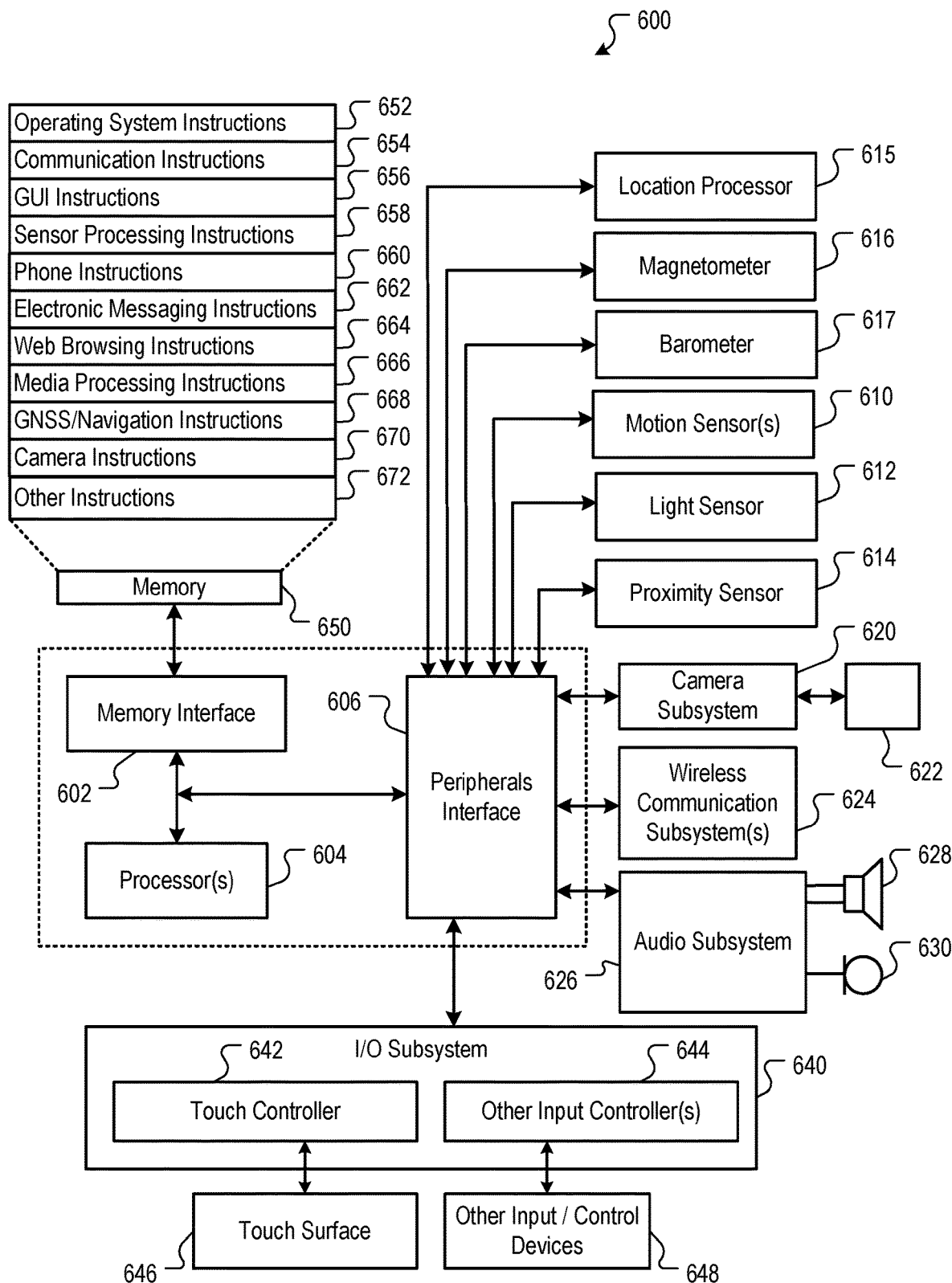
FIG. 6 is a block diagram of example device architecture for implementing the features and processes described in reference to FIGS. 1-5.

FIG. 6 is a block diagram of example device architecture 600 for implementing the features and processes described in reference to FIGS. 1-5. Architecture 600 may be implemented in any mobile device for generating the features and processes described in reference to FIGS. 1-5, including but not limited to smart phones, tablet computers and wearable computers (e.g., smart watches, fitness bands). Architecture 600 may include memory interface 602, data processor(s), image processor(s) or central processing unit(s) 604, and peripherals interface 606. Memory interface 602, processor(s) 604 or peripherals interface 606 may be separate components or may be integrated in one or more integrated circuits. One or more communication buses or signal lines may couple the various components.

Sensors, devices, and subsystems may be coupled to peripherals interface 606 to facilitate multiple functionalities. For example, motion sensor 610, light sensor 612, and proximity sensor 614 may be coupled to peripherals interface 606 to facilitate orientation, lighting, and proximity functions of the device. For example, in some implementations, light sensor 612 may be utilized to facilitate adjusting the brightness of touch surface 646. In some implementations, motion sensor 610 (e.g., an accelerometer, rate gyroscope) may be utilized to detect movement and orientation of the device. Accordingly, display objects or media may be presented according to a detected orientation (e.g., portrait or landscape). For example, motion sensor 610 can be a MEMS gyroscope, as described in reference to FIG. 1.

Other sensors may also be connected to peripherals interface 606, such as a temperature sensor, a barometer 617, a biometric sensor, or other sensing device, to facilitate related functionalities. For example, a biometric sensor can detect fingerprints and monitor heart rate and other fitness parameters.

Location processor 615 (e.g., GNSS receiver chip) may be connected to peripherals interface 606 to provide geo-referencing. Magnetometer sensor 616 (e.g., an integrated circuit chip) is connected to peripherals interface 606 to provide compass direction data that may be used by one or more applications to determine the direction of magnetic North. Magnetometer sensor includes the architecture described in reference to FIGS. 1-4.

Camera subsystem 620 and an optical sensor 622, e.g., a charged coupled device (CCD) or a complementary metal-oxide semiconductor (CMOS) optical sensor, may be utilized to facilitate camera functions, such as recording photographs and video clips.

Communication functions may be facilitated through one or more communication subsystems 624. Communication subsystem(s) 624 may include one or more wireless communication subsystems. Wireless communication subsystems 624 may include radio frequency receivers and transmitters and/or optical (e.g., infrared) receivers and transmitters. Wired communication systems may include a port device, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and implementation of the communication subsystem 624 may depend on the communication network(s) or medium(s) over which the device is intended to operate. For example, a device may include wireless communication subsystems designed to operate over a global system for mobile communications (GSM) network, a GPRS network, an enhanced data GSM environment (EDGE) network, IEEE802.xx communication networks (e.g., Wi-Fi, Wi-Max, ZigBee™), 3G, 4G, 4G LTE, code division multiple access (CDMA) networks, near field communication (NFC), Wi-Fi Direct and a Bluetooth™ network. Wireless communication subsystems 624 may include hosting protocols such that the device may be configured as a base station for other wireless devices. As another example, the communication subsystems may allow the device to synchronize with a host device using one or more protocols or communication technologies, such as, for example, TCP/IP protocol, HTTP protocol, UDP protocol, ICMP protocol, POP protocol, FTP protocol, IMAP protocol, DCOM protocol, DDE protocol, SOAP protocol, HTTP Live Streaming, MPEG Dash and any other known communication protocol or technology.

Audio subsystem 626 may be coupled to a speaker 628 and one or more microphones 630 to facilitate voice-enabled functions, such as voice recognition, voice replication, digital recording, and telephony functions.

I/O subsystem 640 may include touch controller 642 and/or other input controller(s) 644. Touch controller 642 may be coupled to a touch surface 646. Touch surface 646 and touch controller 642 may, for example, detect contact and movement or break thereof using any of a number of touch sensitivity technologies, including but not limited to, capacitive, resistive, infrared, and surface acoustic wave technologies, as well as other proximity sensor arrays or other elements for determining one or more points of contact with touch surface 646. In one implementation, touch surface 646 may display virtual or soft buttons and a virtual keyboard, which may be used as an input/output device by the user.

Other input controller(s) 644 may be coupled to other input/control devices 648, such as one or more buttons, rocker switches, thumb-wheel, infrared port, USB port, and/or a pointer device such as a stylus. The one or more buttons (not shown) may include an up/down button for volume control of speaker 628 and/or microphone 630.

In some implementations, device 600 may present recorded audio and/or video files, such as MP3, AAC, and MPEG video files. In some implementations, device 600 may include the functionality of an MP3 player and may include a pin connector for tethering to other devices. Other input/output and control devices may be used.

Memory interface 602 may be coupled to memory 650. Memory 650 may include high-speed random access memory or non-volatile memory, such as one or more magnetic disk storage devices, one or more optical storage devices, or flash memory (e.g., NAND, NOR). Memory 650 may store operating system 652, such as Darwin, RTXC, LINUX, UNIX, OS X, iOS, WINDOWS, or an embedded operating system such as VxWorks. Operating system 652 may include instructions for handling basic system services and for performing hardware dependent tasks. In some implementations, operating system 652 may include a kernel (e.g., UNIX kernel).

Memory 650 may also store communication instructions 654 to facilitate communicating with one or more additional devices, one or more computers or servers, including peer-to-peer communications. Communication instructions 654 may also be used to select an operational mode or communication medium for use by the device, based on a geographic location (obtained by the GPS/Navigation instructions 668) of the device.

Memory 650 may include graphical user interface instructions 656 to facilitate graphic user interface processing, including a touch model for interpreting touch inputs and gestures; sensor processing instructions 658 to facilitate sensor-related processing and functions; phone instructions 660 to facilitate phone-related processes and functions; electronic messaging instructions 662 to facilitate electronic-messaging related processes and functions; web browsing instructions 664 to facilitate web browsing-related processes and functions; media processing instructions 666 to facilitate media processing-related processes and functions; GPS/Navigation instructions 668 to facilitate GPS and navigation-related processes; camera instructions 670 to facilitate camera-related processes and functions; and other instructions 672 for performing some or all of the features and processes, as described in reference to FIGS. 1-5.

Each of the above identified instructions and applications may correspond to a set of instructions for performing one or more functions described above. These instructions need not be implemented as separate software programs, procedures, or modules. Memory 650 may include additional instructions or fewer instructions. Furthermore, various functions of the device may be implemented in hardware and/or in software, including in one or more signal processing and/or application specific integrated circuits (ASICs).

A number of implementations have been described. Nevertheless, it will be understood that various modifications may be made. Elements of one or more implementations may be combined, deleted, modified, or supplemented to form further implementations. In yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A sensor comprising:
   a mechanical resonator;
   a drive circuit coupled to the mechanical resonator and operable to actuate the mechanical resonator into resonant vibration;
   a sense circuit mechanically coupled to the mechanical resonator, the sense circuit operable to generate a sense signal having an in-phase signal component and a quadrature signal component;
   a demodulator circuit operable to receive the sense signal and a first clock for demodulating the sense signal to separate the in-phase signal component from the quadrature signal component; and
   a duty-cycled phase shifter coupled to the demodulator and a second clock, the duty-cycled phase shifter operable to generate the first clock using the second clock, such that the first clock has an average time delay with a higher resolution than a time delay of the second clock.

2. The sensor of claim 1, wherein the duty-cycled phase shifter is coupled to a phase-locked loop (PLL) and is operable to generate the first clock by duty-cycling the second clock generated by the PLL.

3. The sensor of claim 2, wherein the drive circuit comprises:
   a transducer for converting displacement of the mechanical resonator into a change of capacitance;
   an amplification and signal conditioning circuit coupled to an output of the transducer and operable to convert the change in capacitance to a voltage signal; and
   a phase-shifter circuit coupled to an output of the amplification and signal conditioning circuit and an input of the PLL, the phase-shifter operable to generate a drive signal that controls the resonant vibration of the mechanical resonator.

4. The sensor of claim 3, further comprising:
   an automatic gain control (AGC) circuit coupled to the output of the amplification and signal conditioning circuit and an input of the phase-shifter, the automatic gain control circuit operable to control a gain of the drive signal.

5. The sensor of claim 1, wherein the sense circuit further comprises:
   a transducer mechanically coupled to the mechanical resonator, the transducer operable to convert a displacement of the mechanical resonator into a change in capacitance; and
   an amplification and signal conditioning circuit coupled to the transducer, the amplification and signal conditioning circuit operable to convert the change in capacitance to the sense signal.

6. The sensor of claim 1, wherein the duty-cycled phase-shifter circuit comprises:
   a first counter operable to receive the second clock and to generate a count pulse for every Mth positive or negative transition of the second clock;
   a latch circuit coupled to an output of the first counter, the latch circuit operable to generate a third clock based on the count pulse;
   a second counter coupled to the first counter, the second counter operable to receive the count pulse and to generate a fourth clock based on the count pulse, the fourth clock having a positive or negative transition for every Nth count pulse, where M and N are positive integers greater than zero;

a third counter coupled to an output of the latch circuit, the third counter operable to generate a delay enable signal each time the third counter counts at least to K, where K is a positive integer greater than zero;

an adjustable delay block coupled to the output of the latch circuit, the adjustable delay block operable to receive the second clock and the third clock and to generate a sixth clock that is a delayed version of the third clock;

a delay block coupled to an output of the adjustable delay block, the delay block operable to receive the second clock and the sixth clock and to generate a seventh clock that is a delayed version of the sixth clock; and a multiplexer having a selector input coupled to an output of the third counter to receive the delay enable signal, a first input coupled to an output of the adjustable delay block to receive the sixth clock and a second input coupled to an output of the delay block to receive the seventh clock, the multiplexer operable to select for output as the first clock, the sixth clock or the seventh clock according to the delay enable signal.

7. The sensor of claim 1, wherein the sensor is a micro-electrical-mechanical systems (MEMS) gyroscope.

8. A method comprising:
actuating, by a drive circuit of a sensor, a mechanical resonator into resonant vibration;
generating, by a sense circuit of the sensor, a sense signal having an in-phase signal component and a quadrature signal component, the sense circuit mechanically coupled to the mechanical resonator;
generating, by a duty-cycled phase shifter circuit of the sensor, a duty-cycled clock using a reference clock, the duty-cycled clock having an average time delay resolution and the reference clock having a time delay resolution, where the average time delay resolution of the duty-cycled clock is higher than the time delay resolution of the reference clock; and
demodulating, by a demodulator circuit of the sensor, the sense signal using the duty-cycled clock to separate the in-phase signal component from the quadrature signal component.

9. The method of claim 8, wherein the sensor is a micro-electrical-mechanical systems (MEMS) gyroscope.

10. The method of claim 8, where generating the sense signal further comprises:
converting displacement of the resonating mechanical resonator into a change of capacitance; and
converting the change of capacitance into the sense signal.

11. The method of claim 8, wherein generating the duty-cycled clock further comprises:
dynamically adjusting the duty-cycled clock period by a multiple of the reference clock period.

12. A demodulation circuit comprising:
a demodulator circuit having a first input for receiving a modulated signal and a second input for receiving a first clock having an average time delay resolution, the demodulator circuit operable to demodulate the modulated signal into in-phase and quadrature signal components using the first clock; and
a duty-cycled phase-shifter circuit coupled to the demodulator circuit, the duty-cycled phase-shifter operable to generate the first clock using a second clock having a time delay resolution, where the average time delay resolution of the first clock is higher than the time delay resolution of the second clock.

13. The demodulator circuit of claim 12, further comprising:
a phase-locked loop (PLL) circuit coupled to the duty-cycled phase-shifter circuit for generating the first clock signal.

14. The demodulation circuit of claim 12, wherein the duty-cycled phase-shifter circuit comprises:
a first counter operable to receive the second clock and to generate a count pulse for every Mth positive transition of the second clock;
a latch circuit coupled to an output of the first counter, the latch circuit operable to generate a third clock based on the count pulse;
a second counter coupled to the first counter, the second counter operable to receive the count pulse and to generate a fourth clock based on the count pulse, the fourth clock having a positive transition for every Nth count pulse, where M and N are positive integers greater than zero;
a third counter coupled to an output of the latch circuit, the third counter operable to generate a delay enable signal each time the third counter counts at least to K, where K is a positive integer greater than zero;
an adjustable delay block coupled to the output of the latch circuit, the adjustable delay block operable to receive the second clock and the third clock and to generate a sixth clock that is a delayed version of the third clock;
a delay block coupled to an output of the adjustable delay block, the delay block operable to receive the second clock and the sixth clock and to generate a seventh clock that is a delayed version of the sixth clock; and
a multiplexer having a selector input coupled to an output of the third counter to receive the delay enable signal, a first input coupled to an output of the adjustable delay block to receive the sixth clock and a second input coupled to an output of the delay block to receive the seventh clock, the multiplexer operable to select one of the sixth clock and the seventh clock as a duty-cycled clock at an output of the multiplexer according to the delay enable signal.

15. A method comprising:
demodulating, by a demodulator circuit, a modulated signal into in-phase and quadrature signal components using a duty-cycled clock; and
generating, by a duty-cycled phase-shifter circuit, the duty-cycled clock using a reference clock, where the duty-cycled clock has an average time delay resolution and the reference clock has a time delay resolution, and the average time delay resolution of the duty-cycled clock is higher than the time delay resolution of the reference clock.

16. The method of claim 15, wherein generating the duty-cycled clock further comprises:
dynamically adjusting the duty-cycled clock period by a multiple of the reference clock period.

17. A system comprising:
means for actuating a mechanical resonator into resonant vibration;
means for generating a sense signal in response to displacement of resonating mechanical resonator, the sense signal having an in-phase signal component and a quadrature signal component;
means for generating a duty-cycled clock from a reference clock, the duty-cycled clock having an average time delay resolution and the reference clock having a time delay resolution, where the average time delay resolution is higher than the time delay resolution; and means for demodulating the sense signal using the duty-cycled clock to separate the in-phase signal component from the quadrature signal component.

18. The system of claim 17, wherein the sensor is a micro-electrical-mechanical systems (MEMS) gyroscope.

19. The system of claim 17, where generating the sense signal further comprises:

converting displacement of the resonating mechanical resonator into a change of capacitance; and converting the change of capacitance into the sense signal.

20. The system of claim 17, wherein generating the duty-cycled clock further comprises:

means for dynamically adjusting the duty-cycled clock period by a multiple of the reference clock period.

\* \* \* \* \*